United States Patent [19]

Tenjin

[11] Patent Number: 5,003,620
[45] Date of Patent: Mar. 26, 1991

[54] TUNER CIRCUIT AND RECEIVING BAND CHANGE-OVER CIRCUIT WITH A PUSH-PULL AMPLIFIER

[75] Inventor: Kaoru Tenjin, Tokyo, Japan
[73] Assignee: NEC Corporation, Japan
[21] Appl. No.: 390,297
[22] Filed: Aug. 7, 1989
[30] Foreign Application Priority Data

Aug. 9, 1988 [JP] Japan ................. 63-199404

[51] Int. Cl.$^5$ ................................................ H04B 1/26
[52] U.S. Cl. ...................... 455/180; 455/189; 455/190; 455/332
[58] Field of Search ............... 455/180, 188, 189, 190, 455/191, 332

[56] References Cited

U.S. PATENT DOCUMENTS

| | | | |
|---|---|---|---|
| 4,157,505 | 6/1979 | Owens | 455/161 |
| 4,291,290 | 9/1981 | Ijichi et al. | 455/190 |
| 4,418,428 | 11/1983 | Evans | 455/189 |
| 4,495,650 | 1/1985 | Konishi et al. | 455/190 |
| 4,736,457 | 4/1988 | Kupfer | 455/196 |

*Primary Examiner*—Reinhard J. Eisenzopf
*Assistant Examiner*—Lisa Charouel
*Attorney, Agent, or Firm*—Leydig, Voit & Mayer

[57] ABSTRACT

Plural circuits for generating intermediate frequency signals such as UHF, VHF, HYPER intermediates frequency signals, etc. are provided in parallel. Each of the plural circuits includes an intermediate frequency amplifier, whose output impedance varies between high and low impedances dependent on whether or not the circuit operates. Thus, an intermediate frequency signal selected from the UHF, VHF, HYPER intermediate frequency signals is supplied from a circuit selected to be in operation from the plural circuits to an intermediate frequency signal output terminal.

4 Claims, 4 Drawing Sheets

TUNER CIRCUIT AND RECEIVING BAND CHANGE-OVER CIRCUIT WITH A PUSH-PULL AMPLIFIER

FIELD OF THE INVENTION

The invention relates to a tuner circuit and a receiving band change-over circuit, and more particularly to a tuner circuit and a receiving band change-over circuit which are used for an intermediate frequency output circuit in VHF and UHF bands for televisions, video tape recorders and the like.

BACKGROUND OF THE INVENTION

A conventional tuner circuit comprises a UHF mixer for generating a UHF intermediate frequency signal by combining a UHF RF (radio frequency) signal and a local oscillation frequency signal, a VHF mixer for generating a VHF intermediate frequency signal by combining a VHF RF signal and a local oscillation frequency signal, and an IF amplifier for amplifying the UHF and VHF intermediate frequency signals, and a switching diode for connecting the UHF mixer to the VHF mixer.

In operation, the UHF RF signal is supplied to the UHF mixer along with the local oscillation frequency signal, so that the UHF intermediate frequency signal is generated in the UHF mixer. The UHF intermediate frequency signal is supplied through the switching diode to the VHF mixer which functions as an IF amplifier in the UHF operation. Thus, the UHF intermediate frequency signal is amplified in the UHF mixer, and the amplified UHF intermediate frequency signal is further amplified in the IF amplifier to provide a predetermined UHF intermediate signal which is supplied to a following stage in a television set or a video tape recorder system. In the VHF operation, on the other hand, the VHF RF signal and the local oscillation frequency signal are supplied to the VHF mixer, in which the VHF intermediate frequency signal is generated to be supplied to the IF amplifier. Thus, a predetermined VHF intermediate signal is supplied to a following stage in the television set or the video tape recorder system.

However, the conventional tuner circuit has disadvantages as follows.

(1) The control of a total gain in the UHF and VHF bands is difficult, because the VHF mixer is used as the IF amplifier for the UHF intermediate frequency signal.

(2) A change-over device such as the switching diode is necessary to connect the UHF mixer to the VHF mixer.

(3) The VHF RF signal tends to leak to the UHF mixer, and the UHF intermediate frequency signal tends to leak to an input terminal side for the VHF RF signal, because the VHF RF signal and the UHF intermediate frequency signal are applied to a common input terminal of the VHF mixer. Especially, the leakage of the VHF RF signal to the UHF mixer results in the deterioration of a noise factor.

SUMMARY OF THE INVENTION

Accordingly, it is an object of the invention to provide a tuner circuit and a receiving band changeover circuit in which the control of a gain is easy independently between the UHF and VHF bands.

It is a further object of the invention to provide a tuner circuit and a receiving band changeover circuit in which a change-over device such as the switching diode is not necessary to be provided.

It is a still further object of the invention to provide a tuner circuit and a receiving band changeover circuit in which the leakages of the UHF intermediate frequency signal to the VHF RF signal input terminal and of the VHF RF signal to the UHF mixer are avoided not to result in the deterioration of a noise factor, etc.

According to the invention, a tuner circuit or a receiving band change-over circuit may comprise plural circuits for generating intermediate frequency signals based on plural radio frequency signals having different frequency bands, respectively, and a common output terminal connected to the plural circuits. Each of the plural circuits includes an output impedance variable means. The impedance value of the output impedance variable means is low in a selected one of the plural circuits, allowing the intermediate frequency signal to be supplied from the selected circuit to the common output terminal. The input impedance values of the output impedance variable means is high in the other plural circuits, preventing the intermediate frequency signals from being supplied from the other plural circuits to the common output terminal. The output impedance variable means includes a push-pull amplifier having a cascade connection of transistors. The push-pull amplifier is connected through an on and off switch to a direct current power supply at one end and through a resistance to the ground at the other end.

BRIEF DESCRIPTION OF THE DRAWINGS

The invention will be described in more detail in conjunction with appended drawings, wherein.

DESCRIPTION OF THE PREFERRED EMBODIMENT

Figure 1:
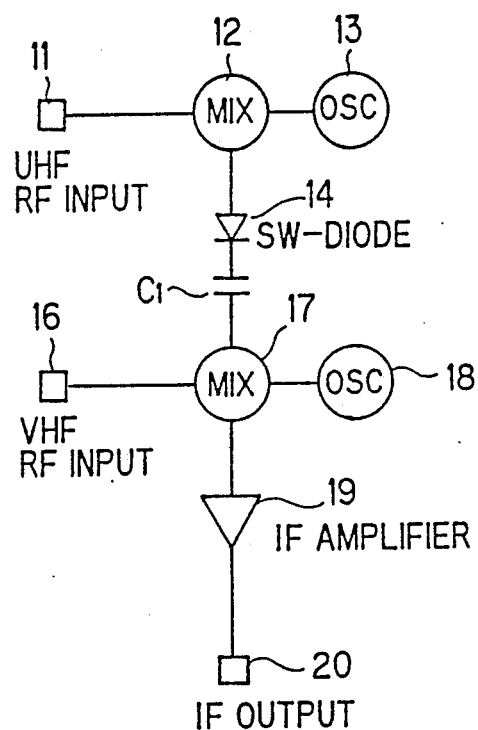
FIG. 1 is a block diagram showing a conventional tuner circuit.

Before explaining a tuner circuit in the embodiment according to the invention, the aforementioned conventional tuner circuit will be explained in FIGS. 1 and 2. In FIG. 1, a UHF RF signal is applied to a UHF RF input terminal 11, and a local oscillation frequency signal is supplied from a local oscillator 13 to a UHF mixer 12, so that a UHF intermediate frequency signal is generated in the UHF mixer 12. The UHF intermediate frequency signal is passed through a switching diode 14 and a capacitor $C_1$ and supplied to a VHF mixer 17 in which the UHF intermediate frequency signal is amplified. The UHF intermediate frequency signal is further amplified in an IF amplifier 19, and then supplied through an IF output terminal 20 to a following stage (not shown). On the other hand, a VHF RF signal is applied to a VHF RF input terminal 16, and a local oscillation, frequency signal is supplied from a local oscillator 18 to a VHF mixer 17, so that a VHF intermediate frequency signal is generated in the VHF mixer 17. The VHF intermediate frequency signal is amplified in the IF amplifier 19, and then supplied through the IF output terminal 20 to a following stage (not shown).

Figure 2:
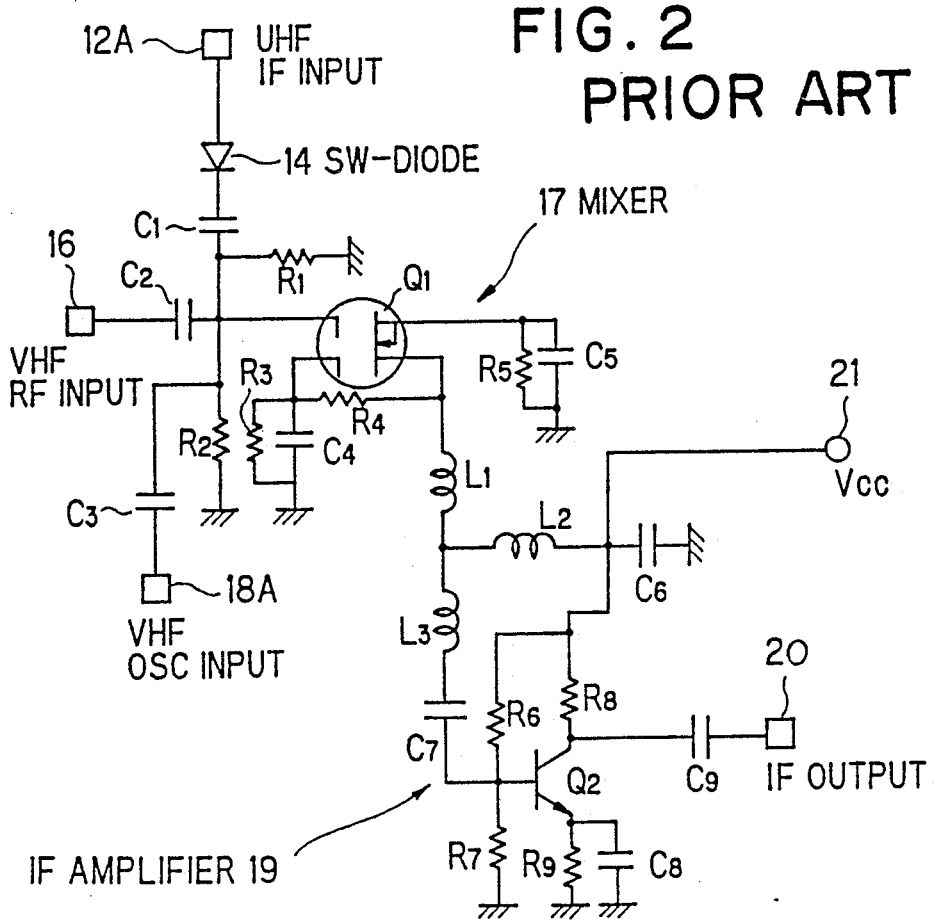
FIG. 2 is a circuitry diagram showing the conventional tuner circuit.

The VHF mixer 17 and the IF amplifier 19 are shown in more detail in FIG. 2. The VHF mixer 17 includes a field effect transistor (FET) $Q_1$, to a common input gate terminal of which a UHF intermediate frequency signal input terminal 12A is connected through the switching diode 14 and the capacitor $C_1$, the VHF RF input terminal 16 is connected through a capacitor $C_2$, and a VHF local oscillation frequency signal input terminal 18A is connected through a capacitor $C_3$, respectively. The common input terminal of the FET $Q_1$ is further connected through a resistance $R_2$ to the ground, and the other gate terminal of the FET $Q_1$ is connected through a parallel connection of a resistance $R_3$ and a capacitor $C_4$ to the ground. On the other hand, a source terminal of the FET $Q_1$ is connected through a parallel connection of a resistance $R_5$ and a capacitor $C_5$ to the ground, and a drain terminal of the FET $Q_1$ is connected through a resistance $R_4$ to the other gate terminal of the FET $Q_1$, and functions as an output terminal for the UHF and VHF intermediate frequency signals. The IF amplifier 19 includes a bipolar transistor $Q_2$, to a base terminal of which the drain electrode of the FET $Q_1$ is connected through choke coils $L_1$ and $L_2$ and a capacitor $C_7$, and a grounding resistance $R_7$ is connected. A collector terminal of the transistor $Q_2$ is connected through a resistance $R_8$ to a power supply (Vcc) 21 and through a capacitor $C_9$ to the IF output terminal 20, and an emitter terminal of the transistor $Q_2$ is connected through a parallel connection of a resistance $R_9$ and a capacitor $C_8$ to the ground. A connecting point of the resistance $R_8$ and the power supply 21 is connected through a choke coil $L_2$ to a connecting point of the choke coils $L_1$ and $L_3$, through a capacitor $C_6$ to the ground, and through a resistance $R_6$ to the base terminal of the transistor $Q_2$.

In operation, the UHF intermediate frequency signal is supplied to the UHF intermediate frequency signal input terminal 12A, and then passed through the switching diode 14 and the capacitor $C_1$ to be supplied to the FET $Q_1$ in which the UHF intermediate frequency signal is amplified. The amplified UHF intermediate frequency signal is further amplified in the transistor $Q_2$, and then supplied through the IF output terminal 20 to the following stage (not shown). On the other hand, the VHF RF signal supplied to the VHF RF input terminal 16 and the local oscillation frequency signal supplied to the VHF local oscillation frequency input terminal 18A are combined at the common input gate terminal of the FET $Q_1$ to generate the VHF intermediate frequency signal which is supplied from the drain terminal of the FET $Q_1$ to the base terminal of the transistor $Q_2$, so that the VHF intermediate frequency signal is amplified in the transistor $Q_2$, and then supplied through the IF output terminal 20 to the following stage (not shown). The disadvantages of the conventional tuner circuit are not explained here, because these were explained before.

Figure 3:
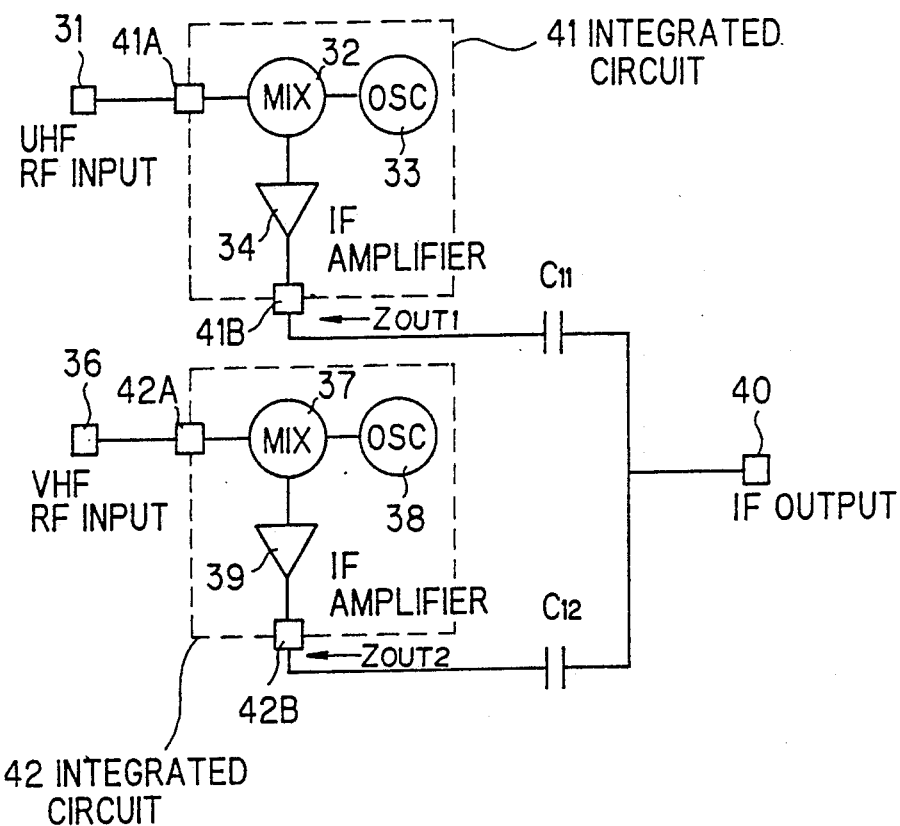
FIG. 3 is a block diagram showing a tuner circuit in an embodiment according to the invention.
Figure 4:
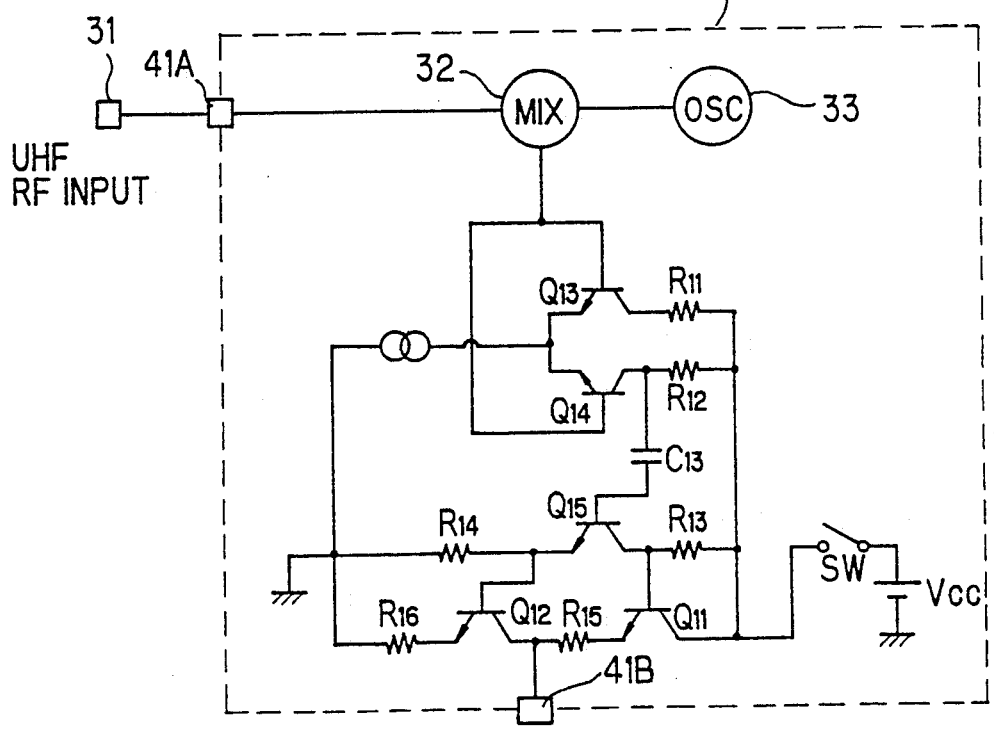
FIG. 4 is a circuitry diagram showing an integrated circuit for generating a UHF intermediate frequency signal in the tuner circuit in FIG. 3.

Next, a tuner circuit in the embodiment according to the invention will be explained in FIG. 3. The tuner circuit comprises two monolithic integrated circuits 41 and 42 having UHF and VHF RF input terminals 31 and 36, respectively. The integrated circuit 41 includes a UHF mixer 32, a local oscillator 33, and an IF amplifier 34, wherein the UHF mixer 32 is connected through a connecting terminal 41A to the UHF RF input terminal 31, and an output of the IF amplifier 34 is connected through a connecting terminal 41B and a capacitor $C_{11}$ to an IF output terminal 40. The integrated circuit 42 includes a VHF mixer 37, a local oscillator 38, and an IF amplifier 39, wherein the VHF mixer 37 is connected through a connecting terminal 42A to the VHF RF input terminal 36, and an output of the IF amplifier 39 is connected through a connecting terminal 42B and a capacitor $C_{12}$ to the IF output terminal 40. The integrated circuit 41 including the IF amplifier 34 is explained in more detail in FIG. 4, wherein like parts are indicated by like reference numerals used in FIG. 3. As shown therein, the IF amplifier 34 includes a push-pull amplifier having a cascade connection of transistors $Q_{11}$ and $Q_{12}$ for receiving out of phase signals, transistors $Q_{13}$ and $Q_{14}$ connected directly at emitters, to resistances $R_{11}$ and $R_{12}$ at collectors, and to the UHF mixer 32 at bases, respectively, a transistor $Q_{15}$ connected to bases of the push-pull transistors $Q_{11}$ and $Q_{12}$ at a collector and at an emitter, respectively, to resistances $R_{13}$ and $R_{14}$ at the collector and at the emitter, respectively, and through a capacitor $C_{13}$ to the collector of the transistor $Q_{14}$, and a power supply Vcc having a switch SW connected to a collector of the transistor $Q_{11}$, through the resistance $R_{13}$ to the collector of the transistor $Q_{15}$, and through the resistances $R_{11}$ and $R_{12}$ to the collectors of the transistors $Q_{13}$ and $Q_{14}$, respectively. In the push-pull transistors $Q_{11}$ and $Q_{12}$, an emitter of the transistor is connected through a resistance $R_{15}$ to a collector of the transistor $Q_{12}$, and an emitter of the transistor $Q_{12}$ is connected through a resistance $R_{16}$ to the ground. The emitter of the transistor $Q_{15}$ is also connected through the resistance $R_{14}$ to the ground. The circuitry structure of the IF amplifier 39 is the same as that of the IF amplifier 34. That is, the integrated circuit 42 is the same in structure as the integrated circuit 41. Therefore, the IF amplifier 39 is not explained in detail here.

In operation of the UHF band, the switch SW of the power supply Vcc is turned on in the integrated circuit 41, and that of the integrated circuit 42 is not turned on. As a result, an output impedance $Z_{OUT1}$ of the integrated circuit 41 becomes a low constant resistance value less than 100 $\Omega$, because current flows through the push-pull transistors $Q_{11}$ and $Q_{12}$ in the integrated circuit 41, while an output impedance $Z_{OUT2}$ of the integrated circuit 42 is high, because no current flows through the push-pull transistors Q11 and $Q_{12}$ in the integrated circuit 42. Therefore, the UHF intermediate frequency signal is supplied from the IF amplifier 34 through the capacitor $C_{11}$ to the IF output terminal 40, so that a direct current component of the UHF intermediate frequency signal is removed therefrom, and the UHF intermediate frequency signal is supplied from the IF output terminal 40 to the following stage. On the contrary, the VHF intermediate frequency signal is not supplied to the IF output terminal 40 due to the high output impedance $Z_{OUT2}$.

In operation of the VHF band, the switch SW of the power supply Vcc is turned on in the integrated circuit 42 and that of the integrated circuit 41 is not turned on. As a result, the output impedance $Z_{OUT2}$ becomes low, while the output impedance $Z_{OUT1}$ becomes high. Thus, the VHF intermediate frequency signal is supplied from the IF output terminal 40 to the following stage.

Figure 5:
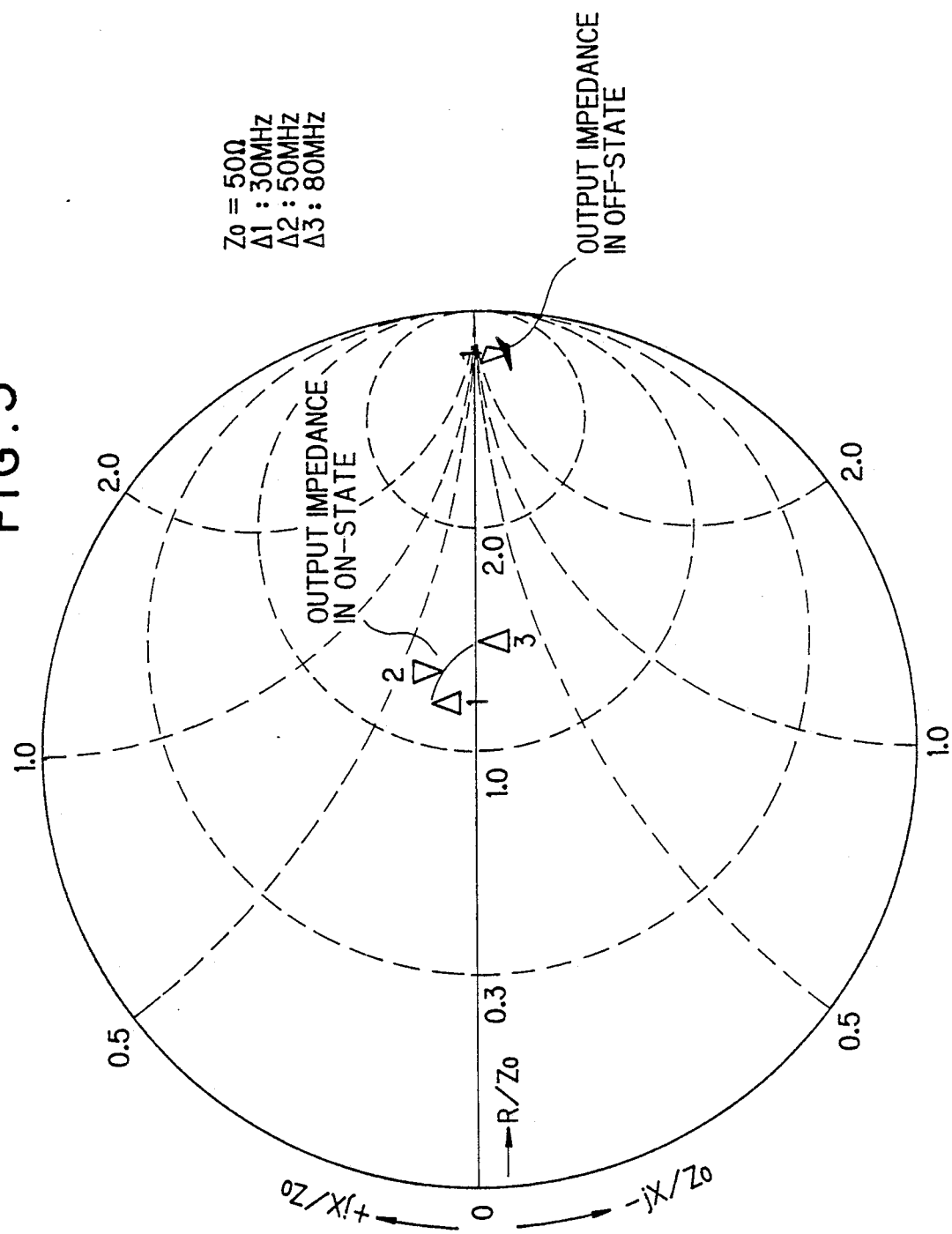
FIG. 5 is a Smith chart showing output impedances in the tuner circuit in the embodiment.

The output impedances $Z_{OUT1}$ and $Z_{OUT2}$ are shown in FIG. 5, wherein it is approximately 75 $\Omega$ of a constant resistance value in the on-state at the frequencies of 30

MHz, 50 MHz, and 80 MHz, where a characteristic impedance $Z_O$ is 50 Ω, while it is approximately 700 Ω in the off-state.

Figure 6:
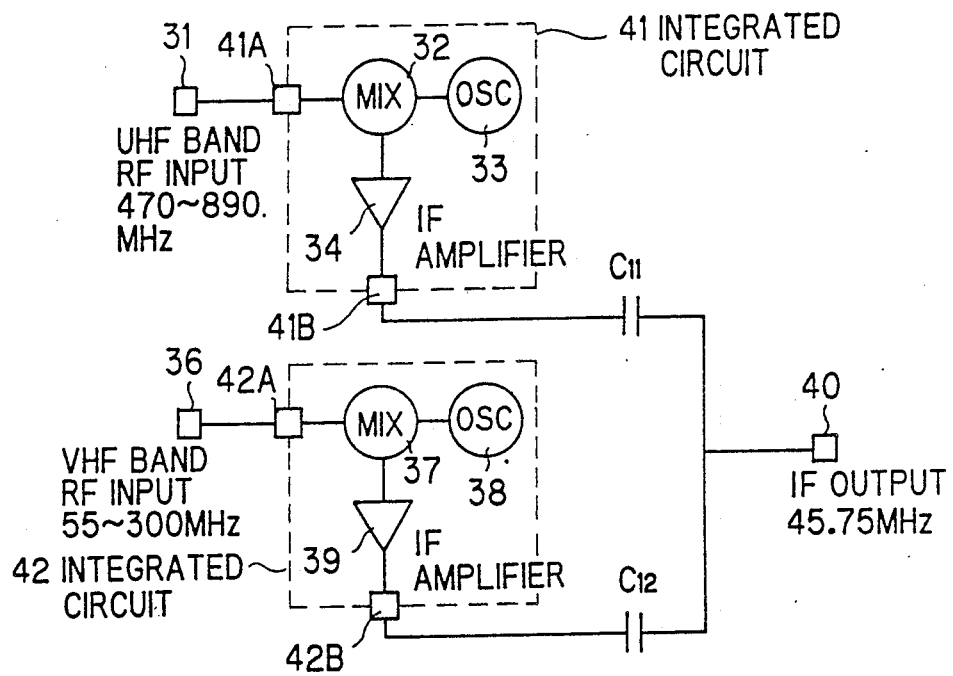
FIGS. 6 and 7 are block diagrams showing two applicable examples of the tuner circuit in the embodiment.

In the embodiment, the UHF RF signal of a frequency 470 to 890 MHz is supplied to the UHF RF input terminal 31 to be combined with the local oscillation frequency signal supplied from the local oscillator 33, so that the UHF intermediate frequency signal of a frequency 45.75 MHz is generated as shown in FIG. 6. On the other hand, a frequency of the VHF RF signal is 55 to 300 MHz. This is a combination tuner for the UHF and VHF bands.

Figure 7:
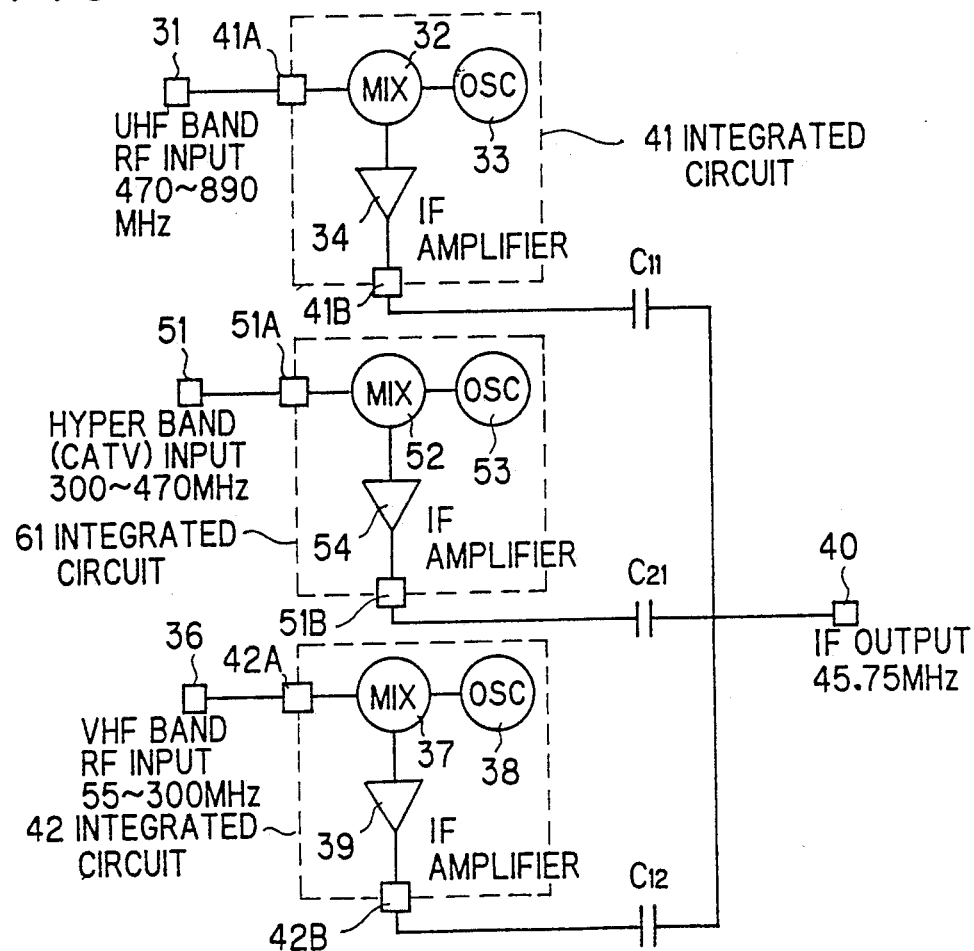

FIG. 7 shows a modification of the embodiment in which a tuner circuit of an integrated circuit 61 is added to the combination tuner. Therefore, the three integrated circuits 41, 42 and 61 are connected to be parallel, wherein like parts are indicated by like reference numerals used in FIGS. 3, 4 and 6. The integrated circuit 61 includes a mixer 52, a local oscillator 53, and an IF amplifier 54, and is connected through a connecting terminal 51A to a HYPER RF signal input terminal 51, and through a connecting terminal 51B and a capacitor $C_{21}$ to the IF output terminal 40. A frequency of a HYPER RF signal which is supplied to the input terminal 51 is 300 to 470 MHz.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A tuner circuit, comprising:
   plural circuits for generating intermediate frequency signals based on plural radio frequency signals having different frequency bands, respectively; and
   a common output terminal connected to said plural circuits;
   wherein each of said plural circuits includes an output impedance variable means, an impedance value of said output impedance variable means being low in a selected one of said plural circuits, whereby said intermediate frequency signal is supplied from said one of said plural circuits to said common output thermal, and impedance values of said output impedance variable means being high in the other circuits, whereby said intermediate frequency signals are not supplied from said other circuits to said common output terminal and wherein said output impedance variable means includes a push-pull amplifier having a cascade connection of transistors, said push-pull amplifier being connected through an on and off switch to a direct current power supply at one end and through a resistance to the ground at the other end.

2. A tuner circuit, according to claim 1, wherein:
   said each of said plural circuits includes an input terminal, to which a radio frequency signal selected from UHF, VHF and HYPER band radio frequency signals is supplied; a local oscillator for generating a local oscillation frequency signal; a mixer for combining said radio frequency signal and said local oscillation frequency signal to generate said intermediate frequency signal selected from UHF, VHF and HYPER intermediate frequency signals; and an IF amplifier for amplifying said intermediate frequency signal.

3. A receiving band change-over circuit, comprising:
   plural circuits for generating intermediate frequency signals based on plural radio frequency signals having different frequency bands, respectively; and
   a common output terminal connected to said plural circuits;
   wherein each of said plural circuits includes an output impedance variable means, an impedance value of said output impedance variable means being low in a selected one of said plural circuits, whereby said intermediate frequency signal is supplied from said one of said plural circuits to said common output terminal, and impedance values of said output impedance variable means being high in the other circuits, whereby said intermediate frequency signals are not supplied from said other circuits to said common output terminal and wherein said output impedance variable means includes a push-pull amplifier having a cascade connection of transistors, said push-pull amplifier being connected through an on and off switch to a direct current power supply at one end and through a resistance to the ground at the other end.

4. A receiving band change-over circuit, according to claim 3, wherein:
   said each of said plural circuits includes an input terminal, to which a radio frequency signal selected from UHF, VHF and HYPER band radio frequency signals is supplied; a local oscillator for generating a local oscillation frequency signal; a mixer for combining said radio frequency signal and said local oscillation frequency signal to generate said intermediate frequency signal selected from UHF, VHF and HYPER intermediate frequency signals; and an IF amplifier for amplifying said intermediate frequency signal.

* * * * *